(12) United States Patent
Grebennikov

(10) Patent No.: US 7,345,534 B2
(45) Date of Patent: Mar. 18, 2008

(54) EFFICIENT POWER AMPLIFICATION SYSTEM

(75) Inventor: Andrei Grebennikov, Co. Cork (IE)

(73) Assignee: M/A-Com Eurotec BV, Amsterdam (NL)

( * ) Notice: Subject to any disclaimer, the term of this patent is extended or adjusted under 35 U.S.C. 154(b) by 137 days.

(21) Appl. No.: 11/141,796

(22) Filed: May 31, 2005

(65) Prior Publication Data

US 2006/0267682 A1 Nov. 30, 2006

(51) Int. Cl.
*H03F 1/14* (2006.01)

(52) U.S. Cl. .................. 330/51; 330/124 R; 330/310

(58) Field of Classification Search .............. 330/51, 330/124 R, 310
See application file for complete search history.

(56) References Cited

U.S. PATENT DOCUMENTS

| | | | |
|---|---|---|---|
| 5,056,109 A | 10/1991 | Gilhousen et al. | |
| 5,257,283 A | 10/1993 | Gilhousen et al. | |
| 5,265,119 A | 11/1993 | Gilhousen et al. | |
| 5,267,262 A | 11/1993 | Wheatley, III | |
| 5,396,516 A | 3/1995 | Padovani et al. | |
| 5,452,473 A | 9/1995 | Weiland et al. | |
| 5,485,486 A | 1/1996 | Gilhousen et al. | |
| 5,590,408 A | 12/1996 | Weiland et al. | |
| 5,655,220 A | 8/1997 | Weiland et al. | |
| 5,661,434 A | 8/1997 | Brozovich et al. | |
| 5,703,902 A | 12/1997 | Ziv et al. | |
| 5,758,269 A | 5/1998 | Wu | |
| 5,774,017 A | 6/1998 | Adar ........................ 330/51 |
| 5,890,051 A | 3/1999 | Schlang et al. | |
| 5,903,554 A | 5/1999 | Saints | |
| 5,974,041 A | 10/1999 | Kornfeld et al. | |
| 6,075,974 A | 6/2000 | Saints et al. | |
| 6,178,313 B1 | 1/2001 | Mages et al. | |
| 6,185,432 B1 | 2/2001 | Vembu | |
| 6,191,653 B1 | 2/2001 | Camp, Jr. et al. | |
| 6,194,963 B1 | 2/2001 | Camp, Jr. et al. | |
| 6,215,987 B1 * | 4/2001 | Fujita ...................... 455/127.3 |
| 6,259,928 B1 | 7/2001 | Vembu | |
| 6,265,935 B1 * | 7/2001 | Kaneda et al. ................ 330/51 |
| 6,272,336 B1 | 8/2001 | Appel et al. | |
| 6,320,913 B1 | 11/2001 | Nakayama | |
| 6,330,462 B1 | 12/2001 | Chen | |
| 6,342,812 B1 * | 1/2002 | Abdollahian et al. ... 330/124 R |
| 6,351,650 B1 | 2/2002 | Lundby et al. | |
| 6,370,109 B1 | 4/2002 | Schwartz et al. | |
| 6,374,085 B1 | 4/2002 | Saints et al. | |
| 6,421,327 B1 | 7/2002 | Lundby et al. | |
| 6,490,460 B1 | 12/2002 | Soliman | |
| 6,603,359 B2 * | 8/2003 | Fujiwara et al. ............ 330/310 |
| 6,615,028 B1 * | 9/2003 | Loke et al. .............. 455/127.1 |
| 6,628,165 B1 | 9/2003 | Henderson et al. | |
| 6,701,134 B1 | 3/2004 | Epperson | |

(Continued)

*Primary Examiner*—Robert Pascal
*Assistant Examiner*—Hieu Nguyen

(57) ABSTRACT

A system for efficient power amplification of an electromagnetic signal includes a switchplexer having at least two inputs and an output. The switchplexer may be configured to provide communication between a selected switchplexer input and the switchplexer output. The system also may include two or more amplifier stages, each having an input and an output, and one or more output matching circuits. Each of the output matching circuits may include an input in communication with one of the amplifier stage outputs, as well as an output in communication with one of the switchplexer inputs. A control unit may be configured to control selection of the selected switchplexer input and to selectively activate at least one of the amplifier stages.

20 Claims, 3 Drawing Sheets

U.S. PATENT DOCUMENTS

| | | |
|---|---|---|
| 6,895,227 B1 * | 5/2005 | Moliere ................... 330/255 |
| 6,906,996 B2 | 6/2005 | Ballantyne |
| 6,954,624 B2 * | 10/2005 | Hamalainen ............ 455/241.1 |
| 7,064,614 B2 * | 6/2006 | Feng et al. ................ 330/296 |
| 2003/0073419 A1 | 4/2003 | Chadwick |
| 2003/0223510 A1 | 12/2003 | Kurakami et al. |
| 2004/0192369 A1 | 9/2004 | Nilsson |
| 2004/0208157 A1 | 10/2004 | Sander et al. |
| 2004/0263245 A1 | 12/2004 | Winter et al. |
| 2005/0030104 A1 | 2/2005 | Chen et al. |
| 2005/0064830 A1 | 3/2005 | Grigore |
| 2005/0110565 A1 | 5/2005 | Robinson |
| 2005/0110568 A1 | 5/2005 | Robinson et al. |

\* cited by examiner

EFFICIENT POWER AMPLIFICATION SYSTEM

FIELD OF THE INVENTION

The invention relates generally to power amplifiers in wireless communication transmitters and transceivers and, more particularly, to a system and method for efficient power amplification.

BACKGROUND OF THE INVENTION

In modern wireless communication systems it may be desirable for a transmitter or transceiver to operate simultaneously in both an efficient and linear manner. It also may be desirable for the transmitter to operate in multiple frequency bands. Power amplifiers used in transmitters may be optimized for use in a particular mode and frequency band to maximize efficiency. Such optimization may require the amplifier to be biased in a certain manner. Additionally, impedances may need to be matched between components within the power amplifier and between the amplifier and adjacent components.

For example, a transmitter may be designed to operate in two separate frequency bands, such as the GSM850/900 (824-915 MHz) and DCS1800/PCS1900 (1710-1910 MHz) frequency bands, or the CDMA800 (824-849 MHz) and CDMA1900 (1850-1910 MHz) frequency bands. Impedance may be dependant on the operating frequency and, therefore, a power amplifier having optimal impedance matching in one frequency band may not be optimized for operation in a different frequency band. Problems related to impedance matching at different frequencies may be solved by providing separate amplifying chains. However, separate amplifying chains may require numerous switches to provide a desired combination of amplifier stages. This may make it difficult to implement the amplifier in a monolithic integrated circuit design. It also may increase the size and the power requirements for the transmitter.

In addition, many wireless communications systems, such as GSM/EDGE, CDMA2000, or WCDMA, may require that the power amplifier be capable of delivering a wide range of output powers. There may be a tradeoff between efficiency and linearity, however, with improvement in one coming at the expense of the other. As a result, being designed for the highest power level with maximum available efficiency, a power amplifier may tend to operate less efficiently at lower power levels, which may shorten the life of a battery and reduce talk time duration.

Several approaches may be used in trying to solve these problems. For example, a dual-band or quad-band mobile phone transmitter may contain two power amplifiers, or a power amplifier module including two separate amplifier chains, each operating in a single frequency band. One problem with this approach, however, is poor efficiency at backoff output powers (i.e., output powers less than the maximum power). This is because amplifiers typically are designed to provide maximum efficiency at maximum output power. In addition, a high-efficiency broadband power amplifier that can operate in a variety of desired frequency bands simultaneously also may require different matching circuitry for different frequencies and/or device impedances.

One system employs a dual-band single-stage power amplifier for operation in either the 800 MHz band or the 1900 MHz band using the same active amplifier device, with different switching impedance networks at both the input and the output, to provide desired input and output impedances for operation in both frequency bands. This approach, however, requires an increase in the number of required switches and impedance networks, which may increase both the size and the power requirements of the power amplifier and the transmitter. In addition, the problem of poor efficiency at backoff power levels remains.

Another system uses a multi-stage power amplifier with bypass switches between stages for selectively bypassing one or more of the amplifier stages. This approach, however, requires switches between amplifier stages, as well as separate input and output matching networks for each stage. These requirements may make it difficult to implement the amplifier in a monolithic integrated circuit design, which may result in increased size and cost of the entire power amplifier and transmitter. In addition, for dual-band or quad-band power amplifier modules, this approach may require entirely separate chains of amplifier stages, switches, and impedance matching circuits for the additional frequency bands.

Accordingly, there is a need for a simple and efficient power amplification system. There is a further need for an efficient amplification system with a simplified implementation that requires a reduced number of external switches and/or impedance matching circuits. There is a further need for an efficient amplification system that is capable of operating in various frequency bands.

BRIEF SUMMARY

According to one aspect of the invention, a system for efficient power amplification of an electromagnetic signal includes a switchplexer having two or more switchplexer inputs and a switchplexer output. The switchplexer may be configured to provide communication between a selected switchplexer input and the switchplexer output. The system may include two or more amplifier stages, each having an input and an output, and one or more output matching circuits. Each output matching circuit may include an input in communication with one of the amplifier stage outputs, as well as an output in communication with one of the switchplexer inputs. A control unit may be configured to control selection of the selected switchplexer input and to selectively activate at least one of the amplifier stages.

According to another aspect of the invention, a system for efficient power amplification of an electromagnetic signal includes one or more interstage matching circuits. Each interstage matching circuit may have an input, a main output, and a bypass output. The system also may include a switchplexer having at least two switchplexer inputs and a switchplexer output. The switchplexer may be configured to provide communication between a selected switchplexer input and the switchplexer output. The system may include two or more amplifier stages, each having an input and an output. The system also may include one or more output matching circuits. Each output matching circuit may include an input in communication with one of the amplifier stage outputs, and an output in communication with one of the switchplexer inputs. A control unit may be configured to control selection of the selected switchplexer input and to selectively activate at least one of the amplifier stages. The input of each interstage matching circuit may be in communication with one of the amplifier stage outputs, and the main output of each interstage matching circuit may be in communication with one of the amplifier stage inputs. In addition, the bypass output of each interstage matching circuit may be in communication with one of the switchplexer inputs.

According to another aspect of the invention, a system for efficient power amplification of an electromagnetic signal in one or more frequency bands includes a band diplexer. The band diplexer may have two or more inputs and an output. The system also may include a switchplexer having at least two switchplexer inputs and a switchplexer output. The switchplexer may be configured to provide communication between a selected switchplexer input and the switchplexer output. The system may include two or more amplifier stages, each having an input and an output, and one or more interstage matching circuits, such as a low-band interstage matching circuit and a high-band interstage matching circuit. Each of the interstage matching circuits may have an input in communication with one of the amplifier stage outputs and a main output in communication with one of the amplifier stage inputs. The low-band and high-band interstage matching circuits also may each include a bypass output in communication with one of the band diplexer inputs. The band diplexer output may be in communication with one of the switchplexer inputs. In addition, the system also may include one or more output matching circuits. Each output matching circuit may include an input in communication with one of the amplifier stage outputs, and an output in communication with one of the switchplexer inputs. A control unit may be configured to control selection of the selected switchplexer input and to selectively activate at least one of the amplifier stages.

Other systems, methods, features and advantages of the invention will be, or will become, apparent to one with skill in the art upon examination of the following figures and detailed description. It is intended that all such additional systems, methods, features and advantages be included within this description.

BRIEF DESCRIPTION OF THE DRAWINGS

The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PRESENTLY PREFERRED EMBODIMENTS

Embodiments of the invention include apparatus, methods and articles of manufacture for amplifying and transmitting electromagnetic waves and signals. For illustration purposes, an exemplary embodiment comprises a power amplifier system. The power amplification systems described in this application may be implemented in a wide range of applications, such as, for example, transmitters, transceivers, etc. For purposes of illustration, an exemplary power amplification system according to one aspect of the invention is illustrated in FIG. 1.

Figure 1:
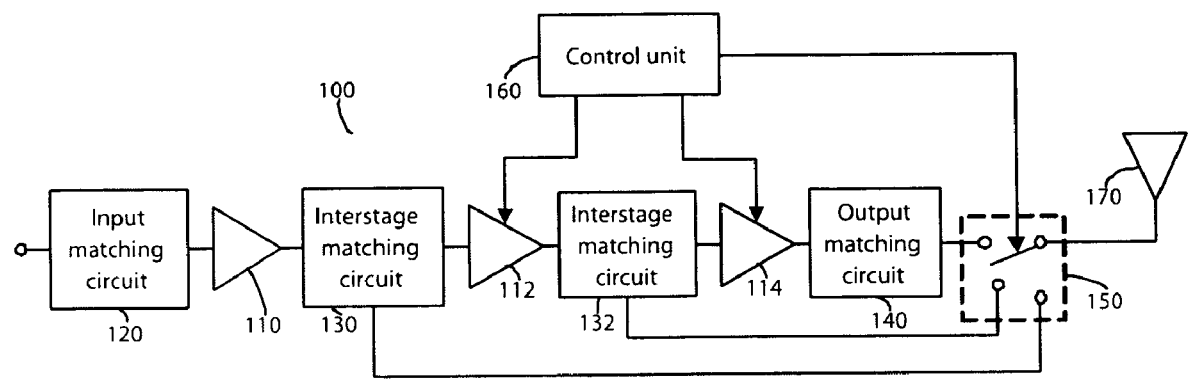
FIG. 1 is a block diagram illustrating a system for efficient power amplification according to one aspect of the invention.

FIG. 1 is a block diagram illustrating a system 100 for efficient power amplification according to one aspect of the invention. The system includes three power amplifier stages 110, 112, and 114. Each of the amplifier stages may include an active device such as a transistor. For example, each of the amplifier stages may be one or more bipolar transistors.

An input matching circuit 120 is in communication with the first amplifier stage 110 and provides impedance matching with the input of the first amplifier stage 110. The system 100 also includes interstage matching circuits 130 and 132. The first interstage matching circuit 130 provides impedance matching between the first and second amplifier stages 110 and 112, with the input of the first interstage matching circuit 130 in communication with the output of the first amplifier stage 110, and the main output of the first interstage matching circuit 130 in communication with the input of the second amplifier stage 112. The first interstage matching circuit also includes a bypass output that is in communication with an input of a switchplexer 150. In a similar manner, the second interstage matching circuit 132 provides impedance matching between the second and third amplifier stages 112 and 114. In this way, the input of the second interstage matching circuit 132 is in communication with the output of the second amplifier stage 112, and the main output of the second interstage matching circuit 132 is in communication with the input of the third amplifier stage 114. Like the first interstage matching circuit 130, the second interstage matching circuit 132 also includes a bypass output that is in communication with another input of the switchplexer 150. An output matching circuit 140 may provide output impedance matching with the third amplifier stage 114, the output of the third amplification stage 114 being in communication with the input of the output matching circuit 140.

The switchplexer 150 may be provided with multiple inputs. For example, as illustrated in FIG. 1, the switchplexer 150 is provided with three separate inputs, one each from the first and second interstage matching circuits 130 and 132, and a third from the output matching circuit 140. A transmit output of the switchplexer 150 may be in communication with an amplifier load 170, such as, for example, an antenna or antenna diplexer. In the case of a transceiver, the switchplexer 150 also may contain one or more receive outputs in communication with a receiver (not shown).

The switchplexer 150 is be configured to provide communication between a selected one of these three inputs and the switchplexer transmit output. For example, the switchplexer 150 may provide switching using one or more field effect transistors. In this way, the system may be configured to provide three different output power levels by providing an amplified output signal from any of the three amplifier stages 110, 112, or 114. For a lower-power amplification, a single amplifier stage may be used to provide a lower-power matched output and the other two stages may be bypassed. In this case, the switchplexer 150 connects the bypass output of the first interstage matching circuit 130 to the output of the switchplexer 150, and the first interstage matching circuit 130 is configured to provide impedance matching between the output of the first amplifier stage 110 and the amplifier load 170. For a medium-power amplification, two of the three amplifier stages may be used to provide a medium-power matched output and the third stage may be bypassed. In this case, the switchplexer 150 connects the bypass output of the second interstage matching circuit 132 to the output of the switchplexer 150, and the second interstage matching circuit 132 is configured to provide impedance matching between the output of the second amplifier stage 112 and the amplifier load 170. For a higher-power amplification, all three amplifier stages may be used to provide a higher-power matched output. In this case, the switchplexer 150 connects the output of the output matching circuit 140 to the output of the switchplexer 150, and the output matching circuit 140 is configured to provide impedance matching between the output of the third amplifier stage 114 and the amplifier load 170.

A bias and switch control unit 160 (hereinafter "control unit") may provide control of the switchplexer 150 and selection of a desired switchplexer input, for example, via a control signal provided by the control unit 160 to the switchplexer 150. In addition, the control unit 160 also may be configured to provide a bias signal for activating and deactivating one or more of the amplifier stages. For example, the control unit 160 may be configured to provide bias activation control signals to the second and third amplifier stages 112 and 114. The control unit may deactivate a given amplifier stage by applying zero voltage to the bias circuit for that stage. In this way, the control unit deactivates one or both of these amplifier stages when they are bypassed. When the output of the second interstage matching circuit 132 is selected as the switchplexer input, the control unit 160 deactivates the third amplifier stage 114. When the output of the first interstage matching circuit 130 is selected as the switchplexer input, the control unit 160 deactivates both the second and third amplifier stages 112 and 114. By deactivating one or more amplifier stages, the power consumption of the amplifier system 100 may be reduced.

The configuration illustrated in FIG. 1 requires a reduced number of external switches by consolidating the switching in switchplexer 150. This configuration also simplifies the implementation into monolithic design because, for example, the input matching circuit 120, all three amplifier stages 110, 112, and 114, and both interstage matching circuits 130 and 132 may be implemented conveniently and relatively inexpensively as a single integrated circuit.

The power amplification system 100 may be implemented using more or fewer amplifier stages and input, interstage, and output matching circuits than shown in FIG. 1, depending on the system requirements and desired number of available power levels. The system 100 also may be configured for operation in either a low-frequency band (e.g., 824-915 MHz) or a high-frequency band (1710-1910 MHz), or it may be designed as a broadband power amplifier for operation in both low and high bands (e.g., from 824 to 1910 MHz) simultaneously.

Figure 2:
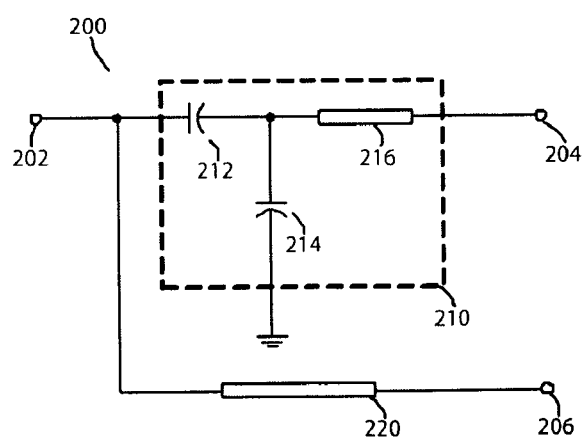
FIG. 2 is a block diagram illustrating an interstage matching circuit according to another aspect of the invention.

FIG. 2 is a block diagram illustrating an interstage matching circuit 200 according to another aspect of the invention. For example, the interstage matching circuit 200 illustrated in FIG. 2 may be suitable for use in place of the first and/or second interstage matching circuits 130 and 132 shown in FIG. 1. The interstage matching circuit 200 is a three-port matching circuit, with one input and two outputs. The interstage matching circuit includes a T-type matching circuit 210 between its input 202 and its main output 204, including capacitors 212 and 214 and a series short transmission line 216. The interstage matching circuit 200 also includes a half-wave transmission line 220 between its input 202 and its bypass output 206. The transmission line 216 provides impedance matching between amplifier stages (e.g., between first and second amplifier stages 110 and 112, as shown in FIG. 1), and the open-circuit half-wave transmission line 220 may have an infinite impedance at its input when its output 206 is not connected to a load (e.g., via switchplexer 150, as shown in FIG. 1). When the bypass output 206 is connected to a load (e.g., via switchplexer 150, as shown in FIG. 1), the characteristic impedance of the half-wave transmission line 220 provides efficient power delivery to the load. Although the interstage matching circuit 200 illustrated in FIG. 2 includes transmission lines and capacitors, other interstage matching circuits may be realized using different lumped and transmission-line elements in accordance with the invention.

Figure 3:
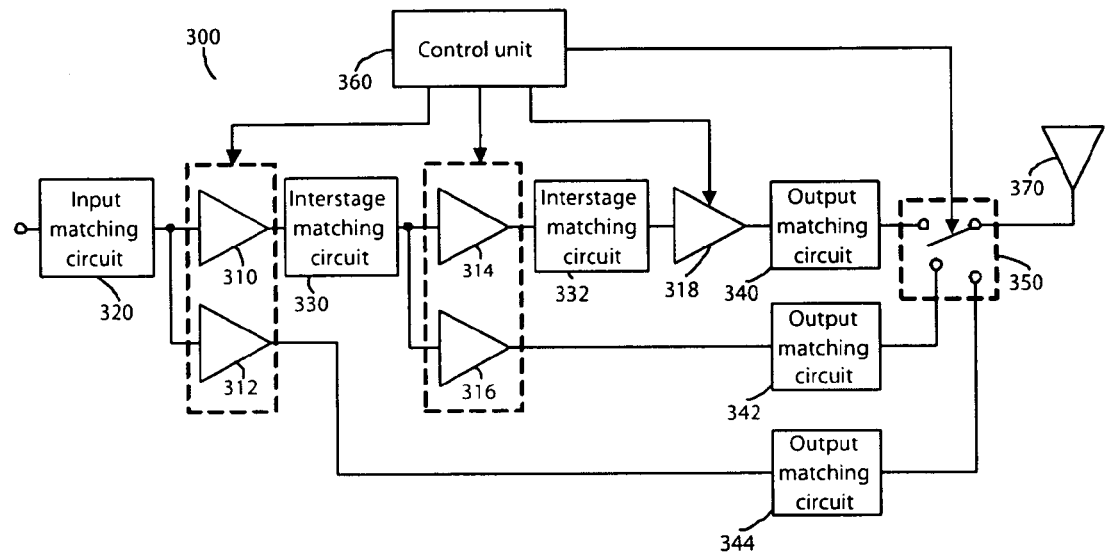
FIG. 3 is a block diagram illustrating a system for efficient power amplification according to another aspect of the invention.

A system for efficient power amplification according to another aspect of the invention is illustrated in the block diagram of FIG. 3. The system 300 includes five power amplifier stages 310, 312, 314, 316, and 318. Each of the amplifier stages may include an active device such as a transistor. For example, each of the amplifier stages may be one or more bipolar transistors.

An input matching circuit 320 is in communication with both of a first pair of amplifier stages 310 and 312 and provides impedance matching with the inputs of a pair of first-stage amplifiers 310 and 312. The system 300 also includes interstage matching circuits 330 and 332. The first interstage matching circuit 330 provides impedance matching between one of the first-stage amplifiers 310 and a pair of second-stage amplifiers 314 and 316, with the input of the first interstage matching circuit 330 in communication with the output of the first-stage amplifier 310, and the output of the first interstage matching circuit 330 in communication with the inputs of both second-stage amplifiers 314 and 316. In a similar manner, the second interstage matching circuit 332 provides impedance matching between one of the second-stage amplifiers 314 and a third-stage amplifier 318. In this way, the input of the second interstage matching circuit 132 is in communication with the output of the second-stage amplifier 314, and the output of the second interstage matching circuit 332 is in communication with the input of the third-stage amplifier 318.

Output matching circuits may provide output impedance matching between various amplifier stages and an amplifier load 370 via a switchplexer 350. For example, when connected to the load 370, output matching circuit 340 provides impedance matching between the load 370 and the output of the third-stage amplifier 318, the output of the third-stage amplifier 318 being in communication with the input of output matching circuit 340. Similarly, when connected to the load 370, output matching circuit 342 provides impedance matching between the load 370 and the output of second-stage amplifier 316, the output of second-stage amplifier 316 being in communication with the input of output matching circuit 342. Output matching circuit 344 also provides impedance matching between the load 370 and first stage amplifier 312 when connected to the load 370, the output of first-stage amplifier 312 being in communication with the input of output matching circuit 344.

The switchplexer 350 may be provided with multiple inputs. For example, as illustrated in FIG. 3, the switchplexer 350 is provided with three separate inputs, one from each of the three output matching circuits 340, 342, and 344. A transmit output of the switchplexer 350 is in communication with an amplifier load 370, such as, for example, an antenna or antenna diplexer. In the case of a transceiver, the switchplexer 350 also may contain one or more receive outputs in communication with a receiver (not shown).

The switchplexer 350 may be configured to provide communication between a selected one of these three inputs and a switchplexer output. For example, the switchplexer 350 may provide switching using one or more field effect transistors. In this way, the system may be configured to provide three different output power levels by providing an amplified output signal from one, two, or three amplifier stages. For a lower-power amplification, a single amplifier stage 312 may be used to provide a lower-power matched output and the other amplifier stages may be bypassed. In this case, the switchplexer 350 provides a connection between output matching circuit 344 and the amplifier load 370. For a medium-power amplification, two amplifier stages (e.g., amplifier stages 310 and 316) may be used to provide a medium-power matched output and the third-stage amplifier 318 may be bypassed. In this case, the switchplexer 350 provides a connection between output matching circuit 342 and the amplifier load 370. For a higher-power amplification, three amplifier stages (e.g., amplifier stages 310, 314, and 318) may be used to provide a higher-power matched output. In this case, the switchplexer 350 provides a connection between output matching circuit 340 and the amplifier load 370.

A bias and switch control unit 360 (hereinafter "control unit") provides control of the switchplexer 350 and selection of a desired switchplexer input, for example, via a control signal provided by the control unit 360 to the switchplexer 350. In addition, the control unit 360 also may be configured to provide a bias signal for activating and deactivating one or more of the amplifier stages 310, 312, 314, 316, and 318. The control unit 360 may deactivate a given amplifier stage by applying zero voltage to the bias circuit for that stage. In this way, the control unit may deactivate one or more of the amplifier stages when they are bypassed. For example, for lower-power, single-stage amplification, the control unit 360 may deactivate amplifier stages 310, 314, 316, and 318. For medium-power, two-stage amplification, the control unit 360 may deactivate amplifier stages 312, 314, and 318. For higher-power, three-stage amplification, the control unit 360 may deactivate amplifier stages 312 and 316. By deactivating one or more amplifier stages, the power consumption of the amplifier system 300 may be reduced.

The power amplification system 300 may be implemented using more or fewer amplifier stages and input, interstage, and output matching circuits in accordance with the invention, depending on the system requirements and desired number of available power levels. In addition, it may be possible to implement parallel amplifier stages using either separate devices with half the power capability of a single one, or just use half the periphery of a single monolithically implemented device for each path. In many cases, to achieve a sufficiently high efficiency at low power level, it is sufficient to connect the device collector of the first or second stage through the blocking capacitor directly to the load (through switchplexer). For example, connection from the second stage may provide a saturated power of 20 dBm with power-added efficiency of 50%, resulting in more than 30% efficiency at 16 dBm power level, and satisfying the linearity requirements. With the first stage (or collector) connected to the switch, a power-added efficiency of more than 20% may be obtained at 12 dBm linear output power, with saturated output power of 16 dBm. By comparison, conventional power amplifiers may provide less than 10% efficiency at an output power of 16 dBm and less than 5% at a power level of 12 dBm.

The configuration illustrated in FIG. 3 requires a reduced number of external switches by consolidating the switching in switchplexer 350. This configuration also simplifies the implementation into monolithic design because, for example, the input matching circuit 320, all five amplifier stages 310, 312, 314, 316, and 318, and both interstage matching circuits 330 and 332 may be implemented conveniently and relatively inexpensively as a single integrated circuit. The system 300 also may be configured for operation in either a low-frequency band (e.g., 824-915 MHz) or a high-frequency band (1710-1910 MHz), or it may be designed as a broadband power amplifier for operation in both low and high bands (e.g., from 824 to 1910 MHz) simultaneously.

Figure 4:
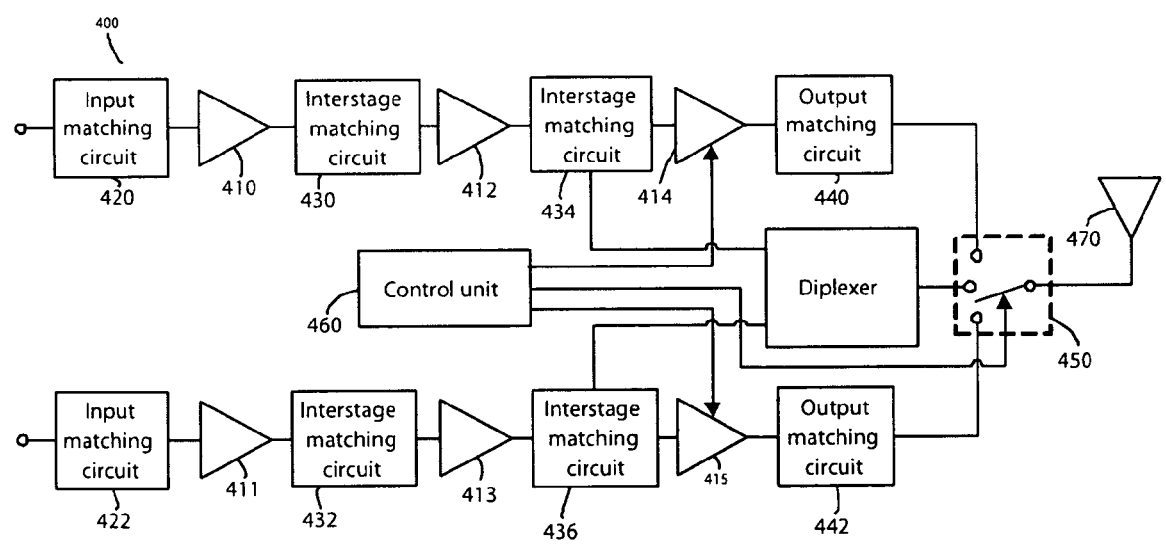
FIG. 4 is a block diagram illustrating a system for efficient multi-band power amplification according to another aspect of the invention.

A system for efficient multi-band amplification according to another aspect of the invention is illustrated in the block diagram of FIG. 4. The system 400 includes two power amplifier chains, each including three amplifier stages. The first amplifier chain, including amplifier stages 410, 412, and 414 may be configured to provide amplification and impedance matching in a low frequency band, such as 824-915 MHz. The second amplifier chain, including amplifier stages 411, 413, and 415, may be configured to provide amplification and impedance matching in a high frequency band, such as 1710-1910 MHz. Each of the amplifier stages may include an active device such as a transistor. For example, each of the amplifier stages may be one or more bipolar transistors.

Each of the amplifier chains may include an input matching circuit as illustrated in FIG. 4, A low-band input matching circuit 420 is in communication with the first amplifier stage 410 in the low-band amplifier chain and may provide impedance matching with the input of amplifier stage 410. Likewise, a high-band input matching circuit 422 is in communication with the first amplifier stage 411 in the high-band amplifier chain and may provide impedance matching with the input of amplifier stage 411.

Each of the amplifier chains may include output matching circuits and interstage matching circuits between amplifier stages. As illustrated in FIG. 4, the low-band amplifier chain includes interstage matching circuit 430, which provides impedance matching between the first and second amplifier stages 410 and 412, with the input of the interstage matching circuit 430 in communication with the output of the first amplifier stage 410, and the output of the interstage matching circuit 430 in communication with the input of the second amplifier stage 412. The low-band amplifier chain also includes a second interstage matching circuit 434, which provides impedance matching between the second and third amplifier stages 412 and 414. In this way, the input of second interstage matching circuit 434 is in communication with the output of the second amplifier stage 412, and the main output of second interstage matching circuit 434 is in communication with the input of the third amplifier stage 414. The low-band amplifier chain also includes an output matching circuit 440, which provides output impedance matching with the third amplifier stage 414, the output of the third amplification stage 414 being in communication with the input of the output matching circuit 440. All of the impedance matching circuits 420, 430, 434, and 440 in the low-band amplifier chain may be configured to provide impedance matching in a lower frequency band, such as 824-915 MHz.

The high-band amplifier chain may include a parallel set of interstage matching circuits 432 and 436 and an output matching circuit 442. All of the impedance matching circuits 422, 432, 436, and 442 in the high-band amplifier chain may be configured to provide impedance matching in a higher frequency band, such as 1710-1910 MHz.

The interstage matching circuits 434 and 436 also include bypass outputs that are in communication with respective inputs of a dual-band diplexer 480. The diplexer 480 provides connection of the bypassing paths from both the low-band and high-band amplifier chains. An example of a dual-band diplexer according to another aspect of the invention is illustrated in the block diagram of FIG. 5. The diplexer 500 illustrated in FIG. 5 includes high-pass and low-pass filters. For example, high-pass filter 510 protects the higher-frequency path from the lower-frequency signal, and include an inductor 512 and two capacitors 514 and 516. Conversely, low-pass filter 520 protects the lower-frequency path from the higher-frequency signal, and includes two inductors 522 and 524 and a capacitor 526. Alternatively, other high-pass and low-pass filters may be suitable for use in the diplexer 500. For example, any of the inductors may be replaced by a short transmission line with high characteristic impedance, and any of the capacitors may be replaced by an open-circuit stub.

Figure 6:
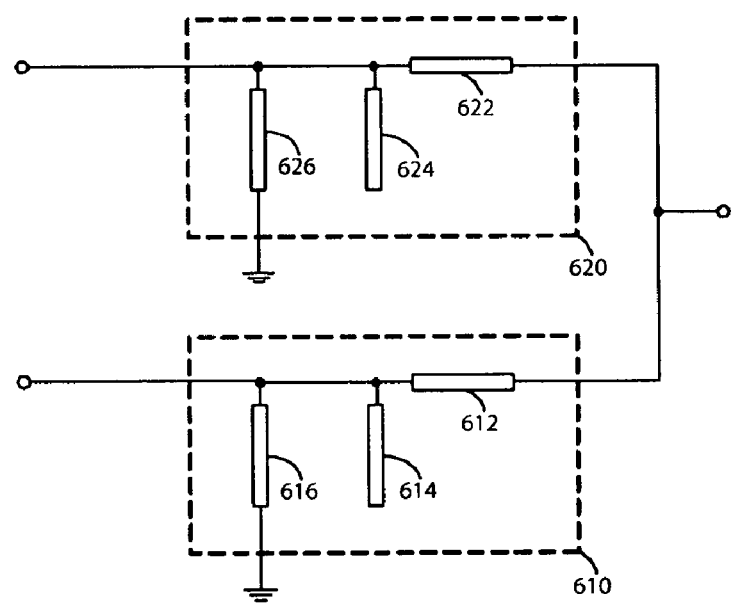
FIG. 6 is a block diagram illustrating a band diplexer according to another aspect of the invention.

According to another aspect of the invention, illustrated in the block diagram of FIG. 6, a dual-band diplexer 600 may be formed with quarter-wave or half-wave transmission lines. For example, a high-pass filter 610 includes transmission lines 612 and 614 having lengths that are quarter-wave at 800 MHz to protect the higher frequency path from the lower frequency signal. Conversely, a low-pass filter 620 includes transmission lines 622 and 624 having lengths that are quarter-wave at 1900 MHz to protect the lower frequency path from the higher frequency signal. To reduce or eliminate any additional required matching, two transmission lines 616 and 626 are connected to ground and chosen to realize the parallel equivalent circuits with open-circuit stubs. For example, the combined length of the transmission lines 614 and 616 may be half-wave at 1900 MHz. Likewise, the combined length of transmission lines 624 and 626 may be half-wave at 800 MHz. The series transmission lines may be selected to have, for example, 50 Ohm characteristic impedances.

Figure 5:
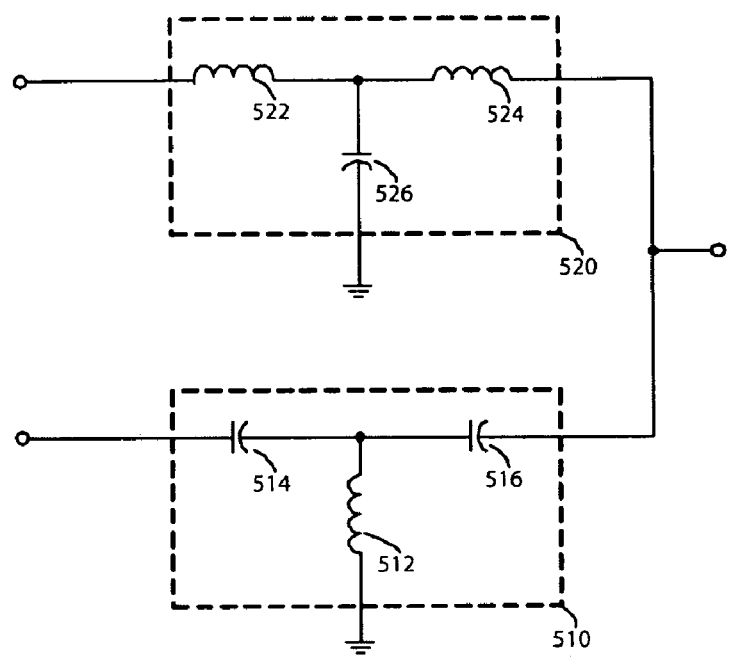
FIG. 5 is a block diagram illustrating a band diplexer according to another aspect of the invention.

Either of the dual-band diplexers 500 and 600 illustrated in FIGS. 5 and 6 is suitable for use as diplexer 480 shown in FIG. 4. The band diplexer 480 also may be implemented using other combinations of lumped elements and transmission lines. The use of diplexer 480 simplifies the implementation of the amplification system 400 into monolithic design. In addition, the band diplexer 480 may be utilized as a two-branch impedance matching circuit. To further simplify the system 400, a separate dual-band diplexer may be used in place of the two output matching circuits 440 and 442.

Returning to FIG. 4, a switchplexer may be provided with multiple inputs. For example, the switchplexer 450 is provided with three separate inputs, one each from the low-band and high-band output matching circuits 440 and 442, and a third from the dual-band diplexer 480. The output of the switchplexer 450 is in communication with an amplifier load 470, such as, for example, an antenna or antenna diplexer. In the case of a transceiver, the switchplexer 450 also may contain one or more receive outputs in communication with a receiver (not shown).

The switchplexer 450 is configured to provide communication between a selected one of these three inputs and a switchplexer output. For example, the switchplexer 450 may provide switching using one or more field effect transistors. In this way, the system may be configured to selectively provide different output frequency bands and different output power levels at the amplifier load 470. For a higher-power amplification in the lower-frequency band, all three amplifier stages in the low-band amplifier chain may be used to generate a higher-power, lower-frequency matched power output. In this case, the switchplexer 450 provides a connection between output matching circuit 440 and the amplifier load 470. Similarly, for a higher-power amplification in the higher-frequency band, all three amplifier stages in the high-band amplifier chain may be used to provide a higher-power, higher-frequency matched power output. In this case, the switchplexer 450 provides a connection between output matching circuit 442 and the amplifier load 470. For a lower-power amplification in either the lower-frequency band or the higher-frequency band, only the first two amplifier stages in either amplifier chain may be used to provide a lower-power matched power output at either the higher frequency or the lower frequency. In this case, the switchplexer 450 provides a connection between the output of the dual-band diplexer 480 and the amplifier load 470. Output impedance matching in this case is provided by the respective interstage matching circuits 434 and 436, either alone or in combination with impedance matching circuitry included in the dual-band diplexer 480.

A bias and switch control unit 460 (hereinafter "control unit") provides control of the switchplexer 450 and selection of a desired switchplexer input, for example, via a control signal provided by the control unit 460 to the switchplexer 450. In addition, the control unit 460 also may be configured to provide a bias signal for activating and deactivating one or more of the amplifier stages. For example, the control unit 460 is configured to provide bias activation control signals to the third amplifier stages 414 and 416 in both the low-band and high-band amplifier chains. The control unit 460 may deactivate a given amplifier stage by applying zero voltage to the bias circuit for that stage. In this way, the control unit 460 may deactivate one or both of these amplifier stages when they are bypassed (e.g., when the output of the dual-band diplexer 480 is selected as the switchplexer input). By deactivating one or more amplifier stages, the power consumption of the amplifier system 400 may be reduced.

The configuration illustrated in FIG. 4 requires a reduced number of external switches by consolidating the switching in switchplexer 450. This configuration also simplifies the implementation into monolithic design because, for example, both input matching circuits 420 and 422, all six amplifier stages 410, 411, 412, 413, 414, and 415, and all four interstage matching circuits 430, 432, 434, and 436, may be implemented conveniently and relatively inexpensively as a single integrated circuit. Alternatively, each of the two amplifier chains may be implemented as a single integrated circuit.

The power amplification system 400 may be implemented using more or fewer amplifier stages and input, interstage, and output matching circuits in accordance with the invention, depending on the system requirements and desired number of available power levels. The system 400 also may include modified or additional amplifier stage bypass paths. For example, bypassing paths may be provided after the first stage of each amplifier chain (e.g., from interstage matching circuits 430 and 432) instead of after the second stage of each amplifier chain. Alternatively, the system 400 may include bypass paths after both the first and second stages of one or both of the amplifier chains.

Embodiments of the present invention may be used in dual-band and other multi-band architectures, such as with cellular phones. Examples of dual-band architectures include GSM900/DCS1800 or CDMA2000. An example of a tri-band architecture is CDMA2000/W-CDMA.

It is intended that the foregoing detailed description be regarded as illustrative rather than limiting, and that it be understood that the following claims, including all equivalents, are intended to define the scope of this invention.

The invention claimed is:

1. A system for efficient power amplification of an electromagnetic signal, comprising:
   a switchplexer having at least two switchplexer inputs and a switchplexer output, where the switchplexer is configured to provide communication between a selected switchplexer input and the switchplexer output;
   at least one interstage matching circuit;
   at least two amplifier stages, each having an amplifier stage input and an amplifier stage output, where the amplifier stage output of a first one of the amplifier stages is in communication with a first one of the switchplexer inputs via the at least one interstage matching circuit;
   at least one output matching circuit, each having
      an output matching circuit input in communication with a second one of the amplifier stage outputs, and
      an output matching stage output in communication with a second one of the switchplexer inputs; and
   a control unit configured to control selection of the selected switchplexer input and to selectively activate at least one of the amplifier stages.

2. A system for efficient power amplification of an electromagnetic signal as in claim 1, where the switchplexer is configured to receive a first matched power output from the first amplifier stage output and the switchplexer is further configured to receive a second matched power output from the output matching stage output, where the first matched power output has a power level that is different from a power level of the second matched power output.

3. A system for efficient power amplification of an electromagnetic signal as in claim 1, where each of the switchplexer inputs is provided with one of a plurality of power signals, each having a different power output level.

4. A system for efficient power amplification of an electromagnetic signal as in claim 1, where each of the output matching circuits is configured to provide impedance matching within a frequency range of about 824-915 MHz.

5. A system for efficient power amplification of an electromagnetic signal as in claim 1, where each of the output matching circuits is configured to provide impedance matching within a frequency range of about 1710-1910 MHz.

6. A system for efficient power amplification of an electromagnetic signal as in claim 1, where each of the amplifier stages includes a transistor.

7. A system for efficient power amplification of an electromagnetic signal as in claim 1, where the at least one interstage matching circuit includes:
   an interstage matching circuit input in communication with one of the amplifier stage outputs,
   an interstage matching circuit main output in communication with one of the amplifier stage inputs, and
   an interstage matching circuit bypass output in communication with a respective one of the switchplexer inputs.

8. A system for efficient power amplification of an electromagnetic signal as in claim 7, where the at least two amplifier stages and the at least one interstage matching circuit are contained in a single integrated circuit.

9. A system for efficient power amplification of an electromagnetic signal as in claim 7, where the at least one interstage matching circuit further comprises at least two lumped elements.

10. A system for efficient power amplification of an electromagnetic signal as in claim 7, where the at least one interstage matching circuit further comprises at least two transmission lines.

11. A system for efficient power amplification of an electromagnetic signal as in claim 7, where:
   the at least one interstage matching circuit includes a first interstage matching circuit;
   the input of the first interstage matching circuit is connected to the main output of the first interstage matching circuit via a circuit including at least one capacitor and at least one transmission line; and
   the input of the first interstage matching circuit is connected to the bypass output of the first interstage matching circuit via a transmission line.

12. A system for efficient power amplification of an electromagnetic signal as in claim 7, where:
   the at least one interstage matching circuit includes a first interstage matching circuit, where the input of the first interstage matching circuit is in communication with the output of the first amplifier stage, and where the main output of the first interstage matching circuit is in communication with the input of the second amplifier stage; and
   the at least one output matching stage includes a first output matching stage, where the output of the second amplifier stage is in communication with the input of the first output matching stage.

13. A system for efficient power amplification of an electromagnetic signal as in claim 1, where the at least two amplifier stages includes a first low-band amplifier stage, a second low-band amplifier stage, a first high-band amplifier stage, and a second high-band amplifier stage, the system further comprising:
   a band diplexer having a first band diplexer input, a second band diplexer input, and a band diplexer output that is in communication with one of the switchplexer inputs;
   where the at least one interstage matching circuit includes a low-band interstage matching circuit and a high-band interstage matching circuit;
   where the low-band interstage matching circuit includes:
      a low-band interstage matching circuit input in communication with the output of the first low-band amplifier stage,
      a low-band interstage matching circuit main output in communication with the input of the second low-band amplifier stage, and
      a low-band interstage matching circuit bypass output in communication with the first band diplexer input; and
   where the high-band interstage matching circuit includes:
      a high-band interstage matching circuit input in communication with the output of the first high-band amplifier stage,
      a high-band interstage matching circuit main output in communication with the input of the second high-band amplifier stage, and
      a high-band interstage matching circuit bypass output in communication with the second band diplexer input.

14. A system for efficient power amplification of an electromagnetic signal as in claim 13, where the band diplexer further comprises at least two lumped elements.

15. A system for efficient power amplification of an electromagnetic signal as in claim 13, where the band diplexer further comprises at least two transmission lines.

16. A system for efficient power amplification of an electromagnetic signal as in claim 13, where:

the low band interstage matching circuit is configured to provide impedance matching within a frequency range of approximately 824-915 MHz; and the high band interstage matching circuit is configured to provide impedance matching within a frequency range of approximately 1710-1910 MHz.

17. A system for efficient power amplification of an electromagnetic signal, comprising:
   a switchplexer having at least two switchplexer inputs and a switchplexer output, where the switchplexer is configured to provide communication between a selected switchplexer input and the switchplexer output;
   at least two amplifier stages, each having an amplifier stage input and an amplifier stage output;
   an interstage matching circuit, having
      an interstage matching circuit input in communication with the amplifier stage output of a second one of the amplifier stages,
      an interstage matching circuit main output in communication with the amplifier stage input of the first one of the amplifier stages, and
      an interstage matching circuit bypass output in communication with a first one of the switchplexer inputs;
   at least one output matching circuit, each having
      an output matching circuit input in communication with the amplifier stage output of the first one of the amplifier stages, and
      an output matching stage output in communication with a second one of the switchplexer inputs; and
   a control unit configured to control selection of the selected switchplexer input and to selectively activate at least one of the amplifier stages.

18. A system for efficient power amplification of an electromagnetic signal as in claim 17, where the switchplexer is configured to receive a first matched power output from the interstage matching circuit bypass output and the switchplexer is further configured to receive a second matched power output from the output matching stage output, where the first matched power output has a power level that is different from a power level of the second matched power output.

19. A system for efficient power amplification of an electromagnetic signal, comprising:
   a switchplexer having at least two switchplexer inputs and a switchplexer output, where the switchplexer is configured to provide communication between a selected switchplexer input and the switchplexer output;
   at least two low-band amplifier stages, each having an amplifier stage input and an amplifier stage output;
   at least two high-band amplifier stages, each having an amplifier stage input and an amplifier stage output;
   a band diplexer having a first band diplexer input, a second band diplexer input, and a band diplexer output that is in communication with a first one of the switchplexer inputs;
   a low-band interstage matching circuit having
      a low-band interstage matching circuit input in communication with the output of a first one of the low-band amplifier stages,
      a low-band interstage matching circuit main output in communication with the input of a second one of the low-band amplifier stages, and
      a low-band interstage matching circuit bypass output in communication with the first band diplexer input; and
   a high-band interstage matching circuit having
      a high-band interstage matching circuit input in communication with the output of a first one of the high-band amplifier stages,
      a high-band interstage matching circuit main output in communication with the input of a second one of the high-band amplifier stages, and
      a high-band interstage matching circuit bypass output in communication with the second band diplexer input;
   a low-band output matching circuit, having
      an output matching circuit input in communication with the output of the second low-band amplifier stage output, and
      an output matching stage output in communication with a second one of the switchplexer inputs;
   a high-band output matching circuit, having
      an output matching circuit input in communication with the output of the second high-band amplifier stage output, and
      an output matching stage output in communication with a third one of the switchplexer inputs; and
   a control unit configured to control selection of the selected switchplexer input and to selectively activate at least one of the amplifier stages.

20. A system for efficient power amplification of an electromagnetic signal as in claim 19, where:
   the low band interstage matching circuit and the low-band output matching circuit are configured to provide impedance matching within a frequency range of about 824-915 MHz; and
   the high band interstage matching circuit and the high-band output matching circuit are configured to provide impedance matching within a frequency range of about 1710-1910 MHz.

* * * * *